United States Patent
Chen et al.

(10) Patent No.: US 10,879,203 B2
(45) Date of Patent: Dec. 29, 2020

(54) STUD BUMP STRUCTURE FOR SEMICONDUCTOR PACKAGE ASSEMBLIES

(71) Applicant: Taiwan Semiconductor Manufacturing Company, Ltd., Hsinchu (TW)

(72) Inventors: Meng-Tse Chen, Pingtung County (TW); Hsiu-Jen Lin, Hsinchu County (TW); Chih-Wei Lin, Hsinchu County (TW); Cheng-Ting Chen, Taichung (TW); Ming-Da Cheng, Jhubei (TW); Chung-Shi Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/707,591

(22) Filed: Sep. 18, 2017

(65) Prior Publication Data

US 2018/0005973 A1    Jan. 4, 2018

Related U.S. Application Data

(62) Division of application No. 13/460,412, filed on Apr. 30, 2012, now Pat. No. 9,768,137.

(51) Int. Cl.
*H01L 23/00* (2006.01)
*H01L 23/498* (2006.01)
(Continued)

(52) U.S. Cl.
CPC .......... *H01L 24/14* (2013.01); *H01L 21/4853* (2013.01); *H01L 23/49816* (2013.01);
(Continued)

(58) Field of Classification Search
CPC . H01L 2224/14135; H01L 2224/17135; H01L 2224/14179
See application file for complete search history.

(56) References Cited

U.S. PATENT DOCUMENTS 4,097,266 A    6/1978    Eikichi et al.
4,775,833 A    10/1988    Roos et al.
(Continued)

FOREIGN PATENT DOCUMENTS

JP    2005311209    11/2005
KR    1020050001159    1/2005
(Continued)

OTHER PUBLICATIONS

Lau, Flip Chip Technologies, 1996, McGraw-Hill, p. 361-362 & figure 12.4) (Year: 1996).*
(Continued)

*Primary Examiner* — David A Zarneke
(74) *Attorney, Agent, or Firm* — Haynes and Boone, LLP

(57) ABSTRACT

A semiconductor package structure comprises a substrate, a die bonded to the substrate, and one or more stud bump structures connecting the die to the substrate, wherein each of the stud bump structures having a stud bump and a solder ball encapsulating the stud bump to enhance thermal dissipation and reduce high stress concentrations in the semiconductor package structure.

20 Claims, 4 Drawing Sheets

(51) Int. Cl.
*H01L 25/10* (2006.01)
*H01L 21/48* (2006.01)
*H01L 23/367* (2006.01)

(52) U.S. Cl.
CPC .............. *H01L 24/11* (2013.01); *H01L 24/13* (2013.01); *H01L 24/73* (2013.01); *H01L 25/105* (2013.01); H01L 23/3677 (2013.01); H01L 24/16 (2013.01); H01L 24/32 (2013.01); H01L 24/45 (2013.01); H01L 24/48 (2013.01); H01L 2224/1134 (2013.01); H01L 2224/131 (2013.01); H01L 2224/1308 (2013.01); H01L 2224/13076 (2013.01); H01L 2224/13124 (2013.01); H01L 2224/13144 (2013.01); H01L 2224/13147 (2013.01); H01L 2224/14135 (2013.01); H01L 2224/14136 (2013.01); H01L 2224/14179 (2013.01); H01L 2224/16225 (2013.01); H01L 2224/17135 (2013.01); H01L 2224/32145 (2013.01); H01L 2224/32225 (2013.01); H01L 2224/45124 (2013.01); H01L 2224/45144 (2013.01); H01L 2224/45147 (2013.01); H01L 2224/48091 (2013.01); H01L 2224/48227 (2013.01); H01L 2224/73104 (2013.01); H01L 2224/73204 (2013.01); H01L 2225/0651 (2013.01); H01L 2225/1023 (2013.01); H01L 2225/1058 (2013.01); H01L 2924/00012 (2013.01); H01L 2924/00014 (2013.01); H01L 2924/15331 (2013.01); H01L 2924/15787 (2013.01); H01L 2924/3512 (2013.01)

(56) References Cited

U.S. PATENT DOCUMENTS

| | | | |
|---|---|---|---|
| 5,499,036 A | 3/1996 | Hauck et al. | |
| 5,569,960 A | 10/1996 | Kumazawa et al. | |
| 5,598,036 A | 1/1997 | Ho et al. | |
| 5,633,204 A | 5/1997 | Tago et al. | |
| 5,636,767 A | 6/1997 | Marsilio et al. | |
| 5,740,956 A | 4/1998 | Seo et al. | |
| 5,744,759 A | 4/1998 | Ameen et al. | |
| 5,813,115 A | 9/1998 | Misawa et al. | |
| 5,907,187 A | 5/1999 | Koiwa et al. | |
| 6,268,568 B1 * | 7/2001 | Kim | H01L 23/49838 174/250 |
| 6,303,408 B1 | 10/2001 | Smith et al. | |
| 6,330,166 B1 | 12/2001 | Aoyama et al. | |
| 6,337,445 B1 | 1/2002 | Abbott et al. | |
| 6,518,667 B1 | 2/2003 | Ichida et al. | |
| 6,541,857 B2 * | 4/2003 | Caletka | H01L 23/49838 257/738 |
| 6,621,168 B2 | 9/2003 | Sundahl et al. | |
| 6,781,240 B2 | 8/2004 | Choi et al. | |
| 6,798,667 B2 | 9/2004 | Chan et al. | |
| 6,849,802 B2 | 2/2005 | Song et al. | |
| 6,861,288 B2 | 3/2005 | Shim et al. | |
| 6,861,749 B2 * | 3/2005 | Wu | H01L 24/11 257/737 |
| 6,906,417 B2 | 6/2005 | Jiang et al. | |
| 6,915,185 B2 | 7/2005 | Yamamoto et al. | |
| 6,927,491 B1 | 8/2005 | Yamada et al. | |
| 6,965,160 B2 | 11/2005 | Cobbley et al. | |
| 7,038,144 B2 * | 5/2006 | Yasuda | H01L 23/49838 174/260 |
| 7,042,088 B2 | 5/2006 | Ho et al. | |
| 7,053,491 B2 | 5/2006 | Martin et al. | |
| 7,062,088 B1 | 6/2006 | Clauson et al. | |
| 7,265,046 B2 | 9/2007 | Kondo et al. | |
| 7,271,497 B2 | 9/2007 | Joshi et al. | |
| 7,298,033 B2 | 11/2007 | Yoo et al. | |
| 7,501,337 B2 | 3/2009 | Joshi et al. | |
| 7,554,201 B2 | 6/2009 | Kang et al. | |
| 7,557,443 B2 | 7/2009 | Ye et al. | |
| 7,621,762 B2 | 11/2009 | Liaw et al. | |
| 7,679,188 B2 | 3/2010 | Nishimura et al. | |
| 7,750,466 B2 | 7/2010 | Rothman et al. | |
| 7,838,988 B1 | 11/2010 | Gurrum et al. | |
| 7,841,508 B2 * | 11/2010 | Sri-Jayantha | H05K 3/3436 228/180.21 |
| 7,846,829 B2 | 12/2010 | Tanaka et al. | |
| 7,969,004 B2 | 6/2011 | Ohnishi et al. | |
| 8,288,862 B2 | 10/2012 | Khiang et al. | |
| 8,669,137 B2 * | 3/2014 | Nah | H01L 21/563 257/E21.502 |
| 8,669,173 B2 | 3/2014 | Lee et al. | |
| 8,686,560 B2 | 4/2014 | Parvarandeh et al. | |
| 8,790,049 B2 | 7/2014 | Chen | |
| 8,823,159 B2 | 9/2014 | Dalson et al. | |
| 8,901,730 B2 | 12/2014 | Liu et al. | |
| 8,912,651 B2 * | 12/2014 | Yu | H01L 24/16 257/738 |
| 8,928,134 B2 | 1/2015 | Huang et al. | |
| 9,233,835 B2 * | 1/2016 | Aleksov | B23K 35/0288 |
| 9,515,036 B2 | 12/2016 | Yu et al. | |
| 9,553,065 B2 * | 1/2017 | Lin | H01L 23/3171 |
| 9,698,088 B2 * | 7/2017 | Kwon | H01L 23/16 |
| 9,721,912 B2 | 8/2017 | Khandekar et al. | |
| 9,768,137 B2 * | 9/2017 | Chen | H01L 24/14 |
| 9,865,557 B1 * | 1/2018 | Call | H01L 21/4853 |
| 9,881,857 B2 * | 1/2018 | Chen | H01L 23/49811 |
| 2001/0004135 A1 * | 6/2001 | Okamura | H01L 23/49816 257/778 |
| 2003/0134451 A1 | 7/2003 | Chen et al. | |
| 2003/0202332 A1 * | 10/2003 | Reinikainen | H01L 23/49816 361/767 |
| 2004/0262774 A1 | 12/2004 | Kang et al. | |
| 2008/0169574 A1 * | 7/2008 | Molkkari | H01L 21/563 257/782 |
| 2008/0224309 A1 | 9/2008 | Hori et al. | |
| 2009/0065943 A1 | 3/2009 | Rothman et al. | |
| 2012/0299197 A1 * | 11/2012 | Kwon | H01L 23/16 257/777 |
| 2012/0319289 A1 * | 12/2012 | Mori | H01L 24/17 257/773 |
| 2013/0105993 A1 * | 5/2013 | Bahadur | H01L 23/49811 257/782 |
| 2015/0195910 A1 * | 7/2015 | Patel | B23K 1/20 361/679.02 |
| 2016/0118351 A1 | 4/2016 | Yu et al. | |

FOREIGN PATENT DOCUMENTS

| | | |
|---|---|---|
| KR | 1020080044235 | 5/2008 |
| KR | 2011014261 | 2/2011 |
| WO | WO2007016088 | 2/2007 |

OTHER PUBLICATIONS

Office Action dated Jun. 3, 2015 and English translation from corresponding No. KR 10-2015-0060465.
Office Action dated Jul. 24, 2014 and English translation from corresponding No. KR 10-2012-0128152.
Office Action dated Feb. 20, 2014 and English translation from corresponding No. KR 10-2012-0128152.

* cited by examiner

US 10,879,203 B2

STUD BUMP STRUCTURE FOR SEMICONDUCTOR PACKAGE ASSEMBLIES

CROSS-REFERENCE

This application is a division of U.S. application Ser. No. 13/460,412 filed Apr. 30, 2012 and issuing as U.S. Pat. No. 9,768,137, the entire disclosure is incorporated herein by reference.

FIELD

The disclosure relates generally to chip packaging, and more particularly, to stud bump structures for semiconductor package assemblies, such as flip chip, wafer level chip scale package, and package on package assemblies.

BACKGROUND

A flip chip assembly includes a direct electrical connection of a downward facing (that is, "flipped") semiconductor chip, or die, onto a carrier, such as a ceramic substrate or a circuit board, using conductive bump bond pads of the chip. Flip chip assemblies are typically made by placing solder bumps on the bump bond pads of the chip, attaching the solder bumped chip to a carrier, and applying an adhesive underfill between the chip and the carrier.

The bumps of the flip chip assembly serve several functions but are susceptible to failures caused by stresses. Of those functions, the bumps provide electrical conductive paths from the chip to the substrate on which the chip is mounted. The bumps also provide part of the mechanical mounting of the chip to the substrate. Unfortunately, bumps are prone to cracking generally caused by stresses, including stress caused by thermal expansion mismatch between the chip and the carrier substrate. The significant difference of coefficients of thermal expansion introduces stress to the structure when thermal changes occur. Most of the stress concentrates on the corners of the chip and/or flip chip assembly, and the larger the chip, the more stress concentration on the die and/or flip chip assembly. FIG. 2 is a portion of a flip chip assembly illustrating a solder ball or bump 40 mounted to a bond pad 30 of a chip 20. Due to stress caused by the thermal expansion mismatch between the materials in the flip chip assembly, a crack 50 develops in solder bump 40. Such cracks may form more easily under the stress experienced at the joint and may easily propagate across the length of the solder bump 40.

The use of copper in the metal bumps further worsens the problem. Since copper is rigid, a high stress may be applied on the solders adjoining the copper bumps and hence the solders are more prone to cracking.

One solution to the problem caused by differences in coefficients of thermal expansion is to fill the gap between the chip and the substrate using an epoxy underfill. Underfill helps spread the stress and protect the solder bumps or balls. But sometimes the underfill has a high coefficient of thermal expansion that creates a mismatch between the expansion of the chip and the underfill. This mismatch introduces more stress in the package that can result in failures.

Wafer level chip scale package (WLCSP) has been introduced in recent years for generally increasing density, performance, and cost-effectiveness, while decreasing the weight and size of the devices in the electronic packaging industry and to fulfill market demands toward increased miniaturization and functionality. One disadvantage of current WLCSP technology is the formation of cracks between the solder ball and the electrode post. The solder ball or bump is typically placed onto the bump electrode or post directly, relying on the soldered joint for structural integrity. The different layers making up the WLCSP device typically have different coefficients of thermal expansion. As a result, a relatively large stress derived from this difference is exhibited on the joint between the post and the bump electrode, which often causes cracks to form in the bonding area between the bump electrode/post and the solder ball or bump.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
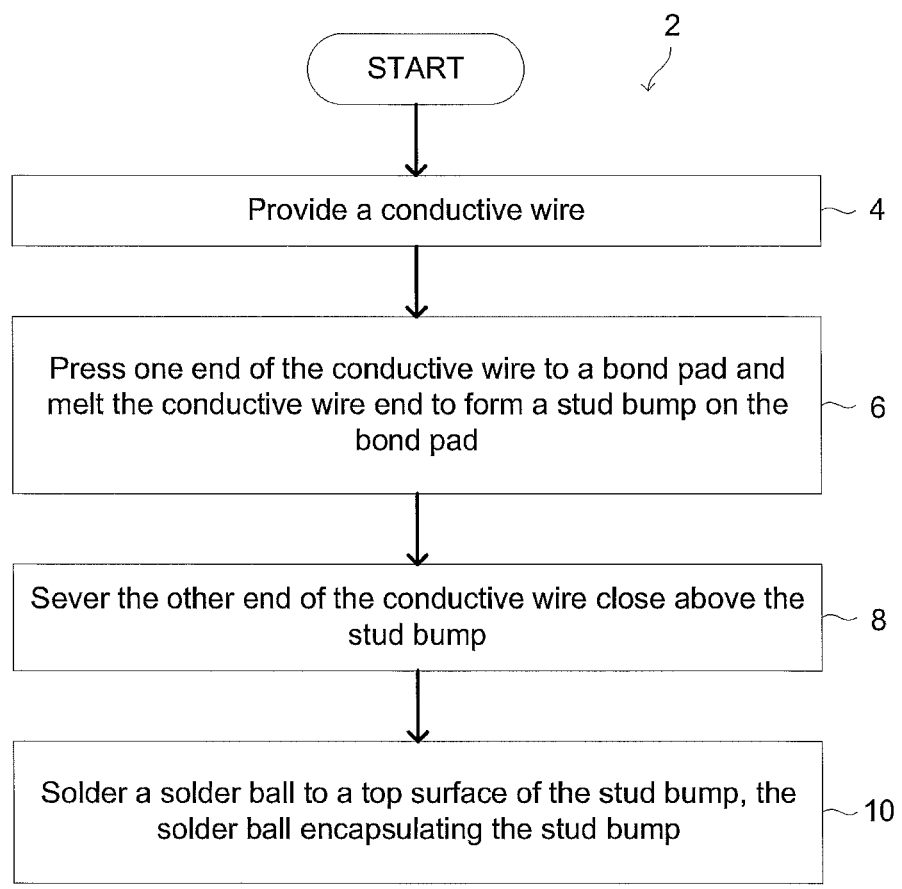
FIG. 1 is a flowchart illustrating a method for fabricating a stud bump structure for semiconductor package assemblies, according to one embodiment of the present disclosure.
Figure 3:
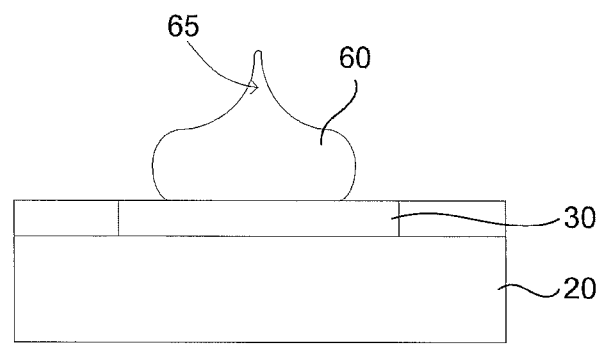
FIG. 3 is a cross-sectional view of a portion of a semiconductor device package at an initial stage of forming a stud bump structure, according to one embodiment of the present disclosure.

Illustrated in FIG. 1 is a flowchart of a method 2 for fabricating a stud bump structure for use in semiconductor package assemblies such as, for example flip chip, wafer level chip scale package, and package on package assemblies, according to various aspects of the present disclosure. The stud bump structure is performed by a stud bump bonder and/or wire bonding tool. Referring to FIG. 1, the method includes block 4, in which a conductive wire is provided. The conductive wire may be comprised of aluminum, aluminum alloy, copper, copper alloy, gold, gold alloy, a lead-free conductor and the like. The method 2 includes block 6, in which one end of the conductive wire is pressed onto a bond pad. The end of the conductive wire is then melted to form a sphere or a stud bump on the bond pad. A wire bonding tool presses this sphere against the bond pad, applying mechanical force, heat, and ultrasonic energy to create a metallic connection. The method 2 includes a block 8, in which the other end of the conductive wire close above the stud bump is severed by a wire cutter. If the move is purely vertical, a "tail" can be left on top of the stud bump. The height and repeatability of this tail is largely dependant on the composition of the wire. FIG. 3 is a cross-sectional view of a stud bump 60 having a tail 65 formed on a bond pad 30 of a die 20. The resulting ball or stud bump 60 remaining on the bond pad 30 provides a permanent, reliable connection to the underlying bond pad metal. It is understood by those skilled in the art that the size of the stud bump 60 is dependant on the size of the wire and the type, as well as the bonding tool and the bonding process.

For applications in which more of a standoff is desirable to help compensate for thermal mismatch, in another embodiment a method allows for the stacking of one stud bump on top of another.

Figure 2:
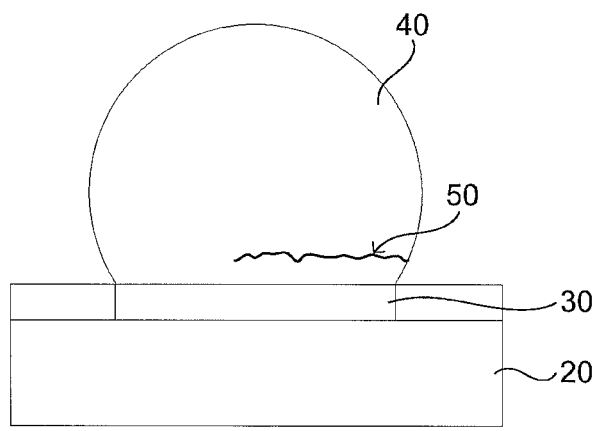
FIG. 2 is a portion of a flip chip assembly exemplifying cracking in the solder ball or bump.
Figure 4:
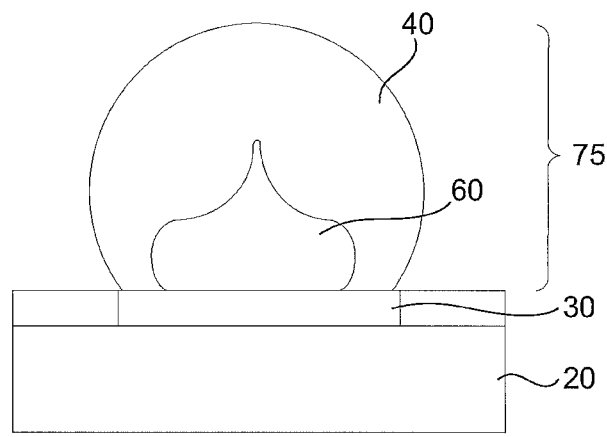
FIG. 4 is a cross-sectional view of a portion of the semiconductor device package of FIG. 3 at another stage of forming a stud bump structure, according to one embodiment of the present disclosure.

The method 2 includes a block 10, in which a solder ball is soldered onto a top surface of the stud bump, the solder ball encapsulating the stud bump. In FIG. 4, a solder ball 40 is soldered onto stud bump 60 and forms around and encapsulates stud bump 60 to form a stud bump structure 75. By forming solder ball 40 around stud bump 60, the shear strength of the joint holding solder ball 40 to die 20 is increased. Thus, a crack, such as crack 50 shown in FIG. 2 that starts at one end of the solder ball 40 will preferably not propagate as readily as in a solder ball devoid of a stub bump 60. The stud bump structure 75 preferably retards the propagation of cracks and increases the shear strength of the solder joint.

It is understood that additional processes may be performed before, during, or after the blocks 2-10 shown in FIG. 1 to complete the fabrication of the stud bump structure, but these additional processes are not discussed herein in detail for the sake of simplicity.

Figure 5:
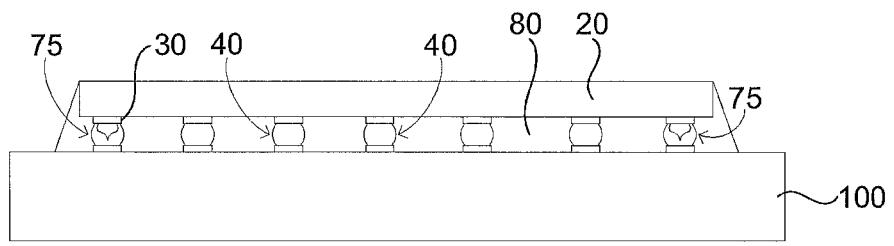
FIG. 5 is a cross-sectional view of a flip chip bump assembly having one or more stud bump structures configured in the flip chip assembly, according to one embodiment of the present disclosure.
Figure 6:
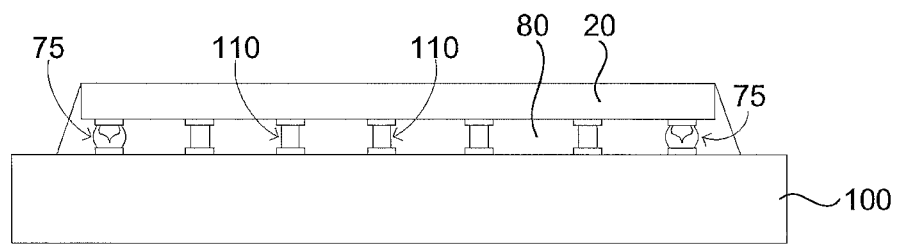
FIG. 6 is a cross-sectional view of a flip chip copper pillar assembly having one or more stud bump structures configured in the flip chip assembly, according to one embodiment of the present disclosure.

Inventive aspects of the present disclosure can be implemented in a variety of semiconductor package assemblies, such as flip chip, wafer level chip scale package, and package on package assemblies to enhance thermal dissipation and reduce high stress concentrations in the package assemblies. FIG. 5 depicts a cross-sectional view of a flip chip bump assembly having one or more stud bump structures 75 configured in the flip chip assembly, according to one embodiment of the present disclosure. The one or more stud bump structures 75 connect a die 20 to a substrate 100, wherein each of the stud bump structures 75 is connected to a bond pad 30. In one embodiment, stud bump structures 75 connect die 20 to substrate 100. As most of the stress concentrates on the corners of the die, in another embodiment the one or more stud bump structures 75 connect die 20 to substrate 100 at approximately the corners of the die 20. In another embodiment the one or more stud bump structures 75 connect die 20 to substrate 100 at approximately the periphery of the die 20. In yet another embodiment, a mix of stud bump structures 75 and solder balls or bumps 40 connect die 20 to substrate 100. In yet another embodiment, in lieu of solder bumps 40, a mix of stud bump structures 75 and copper pillars 110 connect die 20 to substrate 100, as shown in FIG. 6. FIGS. 5 and 6 also illustrate the addition of underfill 80 between die 20 and substrate 100 and around the stud bump structures 75, solder bumps 40, and/or copper pillars 110. Underfill 80 helps spread the stress and protects the stud bump structures 75, solder bumps 40, and/or copper pillars 110.

Figure 7:
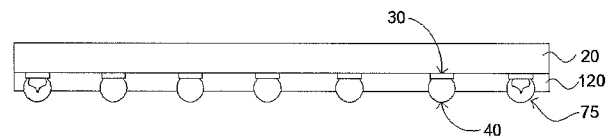
FIG. 7 is a cross-sectional view of a wafer level chip scale package having one or more stud bump structures configured in the package, according to one embodiment of the present disclosure.

FIG. 7 depicts a cross-sectional view of a wafer level chip scale package having one or more stud bump structures 75 configured in the package, according to one embodiment of the present disclosure. The one or more stud bump structures 75 are attached to a die 20, wherein each of the stud bump structures is connected to a bond pad 30. As most of the stress concentrates on the corners of the die 20, in one embodiment the one or more stud bump structures 75 are attached to the die at approximately the corners of the die 20. In another embodiment of the present disclosure, the one or more stud bump structures 75 are attached to die 20 at approximately the periphery of the die 20. In yet another embodiment, a mix of stud bump structures 75 and solder balls 40 are attached to die 20.

FIG. 7 also illustrate the addition of a moulding material 120 around the stud bump structures 75 and/or solder bumps 40. Moulding material 120 helps spread the stress and protects the stud bump structures 75 and/or solder bumps 40.

Figure 8:
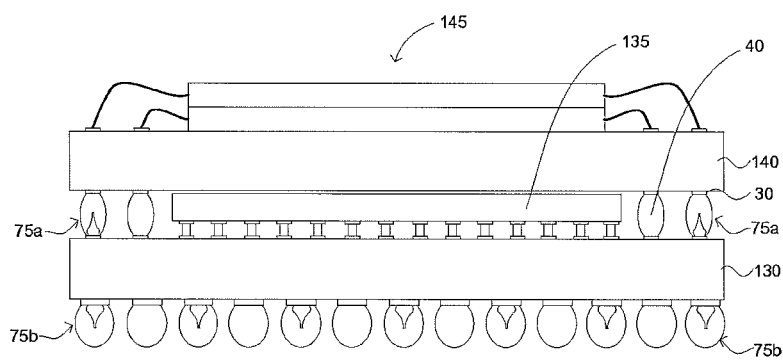
FIG. 8 is a cross-sectional view of a package-on-package structure having one or more stud bump structures configured in the package-on-package, according to one embodiment of the present disclosure.
Figure 9:
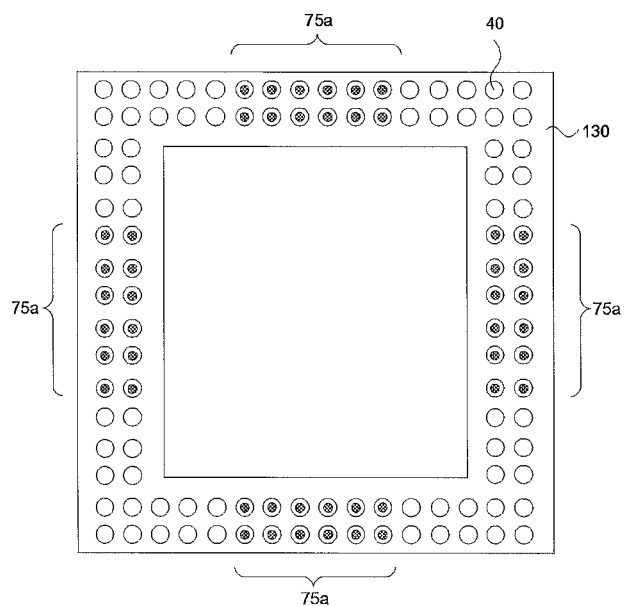
FIG. 9 is a plan view of the package-on-package structure of FIG. 8 showing placement of the stud bump structures, according to one embodiment of the present disclosure.

FIG. 8 is a cross-sectional view of a package-on-package structure having one or more stud bump structures configured in the package-on-package, according to one embodiment of the present disclosure. The package-on-package structure comprises a first substrate 130, a first die 135 attached to the first substrate 130, a second die 145 bonded to the second substrate 140, and one or more stud bump structures 75a connecting the second substrate 140 to the first substrate 130. Each of the stud bump structures is connected to a bond pad 30. As most of the stress concentrates at the corners of first substrate 130 and/or second substrate 140, in one embodiment the one or more stud bump structures 75a connect first substrate 130 to second substrate 140 at approximately the corners of either the first substrate 130 or the second substrate 140. In another embodiment, the one or more stud bump structures 75a connect first substrate 130 to second substrate 140 at approximately the mid sections of either the first substrate 130 or the second substrate 140. FIG. 9 is a plan view of the package-on-package structure of FIG. 8 showing placement of the stud bump structures 75a at the mid sections of first substrate 130. In another embodiment the one or more stud bump structures 75a connect first substrate 130 to second substrate 140 at approximately the periphery of either the first substrate 130 or the second substrate 140. In yet another embodiment, a mix of stud bump structures 75a and solder balls 40 connect first substrate 130 to second substrate 140.

To further dissipate heat from first die 135 and/or second die 145 and enhance thermal dissipation, one or more stud bump structures 75b are attached to an underside of first substrate 130, according to another embodiment.

It is understood that some of the above figures have been simplified for a better understanding of the inventive concepts of the present disclosure. The specific features and materials that are described in the above figures are not intended to limit additional or alternative applications of the present disclosure.

It is further understood that FIGS. 5-9 represent examples of the numbers of stud bump structures that may be formed onto bond pads or posts of the various embodiments on the present invention. Any number of stud bump structures may be formed in semiconductor package assemblies limited only by the technological limits or costs of forming the stud bump structures thereon. The various embodiments of the present invention are not limited to any one number of stud bump structures.

Advantages of one or more embodiments of the present disclosure may include one or more of the following.

In one or more embodiments, the thermal dissipation of the package structure is enhanced.

In one or more embodiments, the package structure is strengthened.

In one or more embodiments, cracks in solder balls or solder bumps caused by stress are reduced.

In one or more embodiments, the propagation of cracks that may form in solder balls or solder bumps is reduced, thus increasing the overall reliability of the package structure.

The present disclosure has described various exemplary embodiments. According to one embodiment, a package structure, includes a substrate, a die bonded to the substrate, and one or more stud bump structures connecting the die to the substrate, wherein each of the stud bump structures having a stud bump and a solder ball encapsulating the stud bump to enhance thermal dissipation and reduce high stress concentrations in the package structure.

According to another embodiment, a package on package structure, includes a first substrate, a first die bonded to the first substrate, a second substrate disposed over the first die and bonded to the first substrate, a second die bonded to the second substrate, and one or more first stud bump structures connecting the second substrate to the first substrate, wherein each of the first stud bump structures having a stud bump and a solder ball encapsulating the stud bump to enhance thermal dissipation and reduce high stress concentrations in the package on package structure.

According to yet another embodiment, a method of forming a stud bump structure in a package structure, includes providing a conductive wire, pressing one end of the conductive wire to a bond pad and melting the conductive wire end to form a stud bump on the bond pad, severing the other end of the conductive wire close above the stud bump, and soldering a solder ball to a top surface of the stud bump, the solder ball encapsulating the stud bump.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method for forming a package structure, the method comprising:
    bonding a first surface of a substrate to a die, wherein the die has a first periphery middle region adjacent a first edge of the die, a second periphery middle region adjacent a second edge of the die opposing the first edge of the die, a first corner region and a second corner region sandwiching the first periphery middle region, and a center region interposing the first periphery middle region and the second periphery middle region, wherein the bonding includes:
        determining a bonding design pattern that is configured to reduce stress when the substrate is bonded to the die, wherein the bonding design pattern provides first stud bump structures disposed within the first periphery middle region, second stud bump structures disposed within the second periphery middle region of the die, and conductive structures disposed within the center region of the die, wherein a shear strength of the first stud bump structures and the second stud bump structures is greater than a shear strength of the conductive structure,
        according to the bonding design pattern, forming the first stud bump structures and the second stud bump structures, wherein each of the first stud bump structures and each of the second stud bump structures includes a stud bump having a tail and a solder ball encapsulating the stud bump on a respective bond pad disposed respectively in the first periphery middle region of the die or the second periphery middle region of the die,
        forming the conductive structures on bond pads disposed in the center region, the first corner region and the second corner region of the die, wherein each of the conductive structures is free of an encapsulating configuration, and
        connecting the die to the substrate via the first stud bump structures, the second stud bump structures, and the conductive structures; and
    forming third stud bump structures on a second surface of the substrate according to a design pattern that is configured to enhance thermal dissipation, wherein the second surface is opposite the first surface and each of the third stud bump structures includes the stud bump having the tail and the solder ball encapsulating the stud bump on a respective bond pad disposed on the second surface of the substrate.

2. The method of claim 1, further comprising forming an underfill between the die and the first surface of the substrate.

3. The method of claim 1, wherein the conductive structures are solder bumps connecting the die to the substrate.

4. The method of claim 1,
    wherein the die further includes a third corner region and a fourth corner region sandwiching the second periphery middle region, and
    wherein the bonding further comprises forming the conductive structures on bond pads disposed in the third corner region and the fourth corner region of the die, wherein each of the conductive structures is free of an encapsulating configuration.

5. The method of claim 1, wherein the substrate is a first substrate, the bonding design pattern is a first bonding design pattern, and the conductive structures are first conductive structures, the method further comprising:

bonding a second substrate to the first surface of the substrate, such that the die is disposed between the second substrate and the first surface of the first substrate, wherein the bonding includes:

determining a second bonding design pattern that is configured to reduce stress when the second substrate is bonded to the first substrate, according to the second bonding design pattern, forming fourth stud bump structures, wherein each of the fourth stud bump structures includes the stud bump having the tail and the solder ball encapsulating the stud bump on a respective bond pad disposed in a periphery region of the first substrate, and forming second conductive structures on bond pads disposed in the periphery region of the first substrate, and connecting the second substrate to the first substrate via the fourth stud bump structures and the second conductive structures.

6. The method of claim 1, wherein the forming each of the first stud bump structures, the second stud bump structures, and the third stud bump structures includes:

providing a conductive wire;

pressing a first end of the conductive wire to a respective bond pad and melting the first end of the conductive wire to form the stud bump on the respective bond pad;

severing a second end of the conductive wire to form the tail of the stud bump; and soldering the solder ball to a top surface of the stud bump, the solder ball encapsulating the stud bump.

7. The method of claim 6, wherein the conductive wire includes aluminum, aluminum alloy, copper, copper alloy, gold, or gold alloy.

8. The method of claim 6, wherein the pressing and the melting is performed by wire bonding tool.

9. The method of claim 6, wherein the pressing and the melting is performed by a stud bump bonder.

10. The method of claim 1, wherein cracks propagate more readily in the conductive structures than in the first stud bump structure or in the second stud bump structures.

11. The method of claim 6, wherein the stud bump is disposed at a corner of the die.

12. A method, comprising:

providing a die bonded to a center of a first substrate by conductive structures, wherein the first substrate includes bond pads along four sides of the first substrate, such that the die is surrounded by the bond pads;

for each first bond pad of a first set of the bond pads disposed in a plurality of middle areas:

pressing a conductive wire onto a respective first bond pad, wherein the pressing includes melting a first end of the conductive wire to form a stud bump on the respective first bond pad, severing a second end of the conductive wire to form a tail on the stud bump, wherein the first end is opposite the second end, soldering a first solder ball onto the stud bump to form a stub bump structure, the first solder ball encapsulating the stud bump including the tail, such that first solder balls having an encapsulating configuration are disposed on the first set of the bond pads;

for each second bond pad of a second set of the bond pads disposed in a plurality of corner areas, soldering a second solder ball onto a respective second bond pad, such that second solder balls that are free of the encapsulating configuration are disposed on the second set of the bond pads, wherein each of the four sides of the first substrate comprises one of the plurality of middle areas sandwiched between two of the plurality of corner areas; and bonding a second substrate to the first substrate via the first solder balls and the second solder balls, such that the die is disposed between second substrate and the first substrate, wherein the conductive structures are free of the encapsulating configuration.

13. The method of claim 12, wherein a shear strength of the stud bump structure is greater than a shear strength of the second solder ball.

14. The method of claim 13, wherein the one of the plurality of first areas sandwiched between the two of the plurality of second areas is disposed at a mid-section in each of the four sides of the first substrate.

15. The method of claim 12, wherein the conductive wire comprises a lead-free conductor.

16. The method of claim 12, wherein the pressing the conductive wire includes introducing heat.

17. The method of claim 12, wherein the pressing the conductive wire includes introducing ultrasonic energy.

18. The method of claim 1, wherein the tail points away from the die.

19. The method of claim 12, wherein the tail points away from the die.

20. The method of claim 12, wherein cracks propagate more readily in second solder ball than in the stud bump structure.

* * * * *